United States Patent [19]

Hopkins et al.

[11] Patent Number: 4,517,106

[45] Date of Patent: May 14, 1985

[54] SOLUBLE SURFACTANT ADDITIVES FOR AMMONIUM FLUORIDE/HYDROFLUORIC ACID OXIDE ETCHANT SOLUTIONS

[75] Inventors: Ronald J. Hopkins, Orchard Park; Evan G. Thomas, East Aurora; Harold J. Kieta, Buffalo, all of N.Y.

[73] Assignee: Allied Corporation, Morris Township, Morris County, N.J.

[21] Appl. No.: 604,112

[22] Filed: Apr. 26, 1984

[51] Int. Cl.$^3$ .................... C09K 13/06; C09K 13/08; B44C 1/22; C03C 15/00

[52] U.S. Cl. ................................ 252/79.4; 156/657; 156/659.1; 252/79.3

[58] Field of Search ................ 252/79.3, 79.4; 156/653, 657, 659.1, 662, 142; 134/3

[56] References Cited

FOREIGN PATENT DOCUMENTS 84974 5/1983 Japan .

*Primary Examiner*—William A. Powell
*Attorney, Agent, or Firm*—Arthur J. Plantamura; Jay P. Friedenson

[57] ABSTRACT

Silicon trioxide etching solutions with soluble surfact additives are provided. The improved silicon dioxide etchants are produced by adding soluble perfluornated surfactant additives to standard oxide etchants in the manufacture of integrated circuits. These surfactant additives are unique because they remain dissolved in the oxide etchant (ammonium fluoride/hydrofluoric acid mixture) even after 0.2 micron filtration. In addition, the filtered solutions retain their surface active properties and are low in metallic ion impurities. The surfactant additives provide etchant solutions with lower surface tensions, which improves substrate wetting and yields better etchant performance. The surfactant does not leave residues or adversely affect etchant profiles.

10 Claims, No Drawings

SOLUBLE SURFACTANT ADDITIVES FOR AMMONIUM FLUORIDE/HYDROFLUORIC ACID OXIDE ETCHANT SOLUTIONS

BACKGROUND OF THE INVENTION

1. Field of the Invention

This invention relates to improved compositions of etching solutions containing soluble surfactant additives. These additives are capable of maintaining reduced surface tensions for improved substrate wetting and are useful in integrated circuit manufacture. Specifically, this invention relates to the utilization of perfluronated alkylsulfonates and/or perfluronated amphoteric surfactants in polar solvent mixtures as additives for suppression of surface tension.

2. Prior Art

As integrated circuit component dimensions become smaller, physical wetting by etchant solutions on substrate surfaces becomes more difficult. This is especially important for buffered oxide ammonium fluoride/hydrofluoric acid etchant solutions used in silicon dioxide etching, since these solutions exhibit extremely high surface tension values of 85 to 90 dyne/cm at typical etching temperatures. Because of the relatively low surface energies of the masking materials used, the photoresist topography, the types of impurities present, and the residual contaminants from other processing steps, it is difficult to properly wet the substrate, which results in non-uniform etching and poor line reproduction.

To overcome these problems, much of the integrated circuit industry has used one of at least two known techniques. The first involves a predip in an aqueous surfactant solution before placing the substrates in the etchant while the second utilizes direct addition of the surfactant to the etchant solution. However, as the industry progresses towards the use of more particulate free systems in which refiltration tanks are employed, and at the same time requires more precisely etched lines with less variation, existing methods have several shortcomings. With the use of predipping, two tanks are required instead of one, which adds an additional processing step. In addition, since wafers are being presoaked, there is a tendency to carry material over from the predip tank to the etchant tank, thus changing the etchant performance and shortening its useful life. More importantly, a major disadvantage associated with both of these methods is that, as experience has indicated most surfactants commonly used by the industry are insoluble in ammonium fluoride/hydrofluoric acid oxide etchant solutions, which causes plating out of the surfactant onto substrate surfaces and plugs the filters (which are of the order of 0.2 micron) commonly used in recirculating etch baths and thus yields etchant solutions with little or no surfactant present. Also, the surfactants used may contain metal ion impurities which can be detrimental to integrated circuit performance or lose activity due to surfactant degradation caused by the presence of hydrofluoric acid in the etchants. Several etchants manufactureres have attempted to incorporate a surfactant in their oxide etchants solutions. However, analysis of these materials shows little, if any, surfactant is present as indicated by surface tension measurements. It is thus apparent that a need exists for an improved, effective silicon dioxide etchant solution with lower surface tension wherein the surfactant maintains surface activity in ammonium fluoride/hydrofluoric acid solutions after filtration through 0.2 micron absolute filters and is essentially free of metal ion.

SUMMARY OF THE INVENTION

This invention entails the use of soluble and stable surfactant additives to buffered oxide etchant solutions for reduction of surface tension to increase surface wetting. These additives remain in solution even after 0.2 micron filtration and are low in metallic ion contamination. Surface tension values of less than 30 dynes per centimeter are common for etchants with these additives compared to values of 85 to 90 dynes per centimeter for etchants without the surfactant additives. Significantly, these materials do not appear to be removed in continuous filtration baths and thus do not plug filters or plate out onto surfaces. Tests performed with the use of these materials indicate increased uniformity of etch is obtained when using etchants containing these additives.

It is accordingly, an object of the present invention to provide a series of silicon dioxide etching solutions having the desirable etching rates and improved wetting over the prior art etching solutions. These improved etchants retain their surface active properties after filtration.

It is a further object of our invention to provide a series of such etching solutions which after 0.2 micron filtration are essentially free of metal ions, having the same rate of etching at the same etching temperatures as prior art solutions, and which have better wetting characteristics for improved etch uniformity, and do not leave residues or adversely affect photoresist adhesion.

These and other objects are accomplished according to our invention wherein etching solutions are provided comprising an aqueous solution of hydrogen fluoride and ammonium fluoride containing between about 1% and 12% by weight hydrogen fluoride (HF), between about 13.5% and 40.5% by weight of ammonium fluoride ($NH_4F$) and a small amount, i.e. in the order of 25 to 20,000 ppm of a surface active agent.

DESCRIPTION OF THE PREFERRED EMBODIMENT

The surfactants found effective in accordance with the invention are referred to as fluorinated alkylsulfonates and have the general formula:

$$XF_2C(CFY)_nSO_3A$$

wherein the fluoroalkyl group in the above formula may be linear or branched, and contain hydroxyl groups. The preferred compounds contain 4 to 7 carbons where X may be F or OH or $SO_3A$; and Y may be F, H, OH or be omitted and thereby impart a double bond; and n has a value of up to 12. The preferred materials have better solubility and are not removed by 0.2 micron filtration. A represents the cation group and may be the $NH_4^+$, $H^+$, $Na^+$, $K^+$, $Li^+$, $R^+$ or organic amine cations, i.e., $NR_4^+$ wherein R is a 1 to 4 carbon alkyl group. However, Na, K and Li salts may not be desirable since they may adversely effect the electrical properties of the circuit. The term "low metal ion content" refers to the omission of any substantial amount of metal ions of groups I and II of the Periodic Table, primarily, Li, Na, K, Ca, and Mg ions.

The new etching solutions of our invention all retain their surface active properties after 0.2 micron filtration, even under continuous filtration conditions. More-over, the new solutions of the invention, despite being filtered, have the property of wetting substrates more effectively and yield more uniform results by etching small geometries (1 to 5 micron) and large geometries (>5 micron) of oxide in patterned resist at the same rate without adding any deleterious effects to prior art solutions.

The HF—NH4F solutions of our invention can be prepared by any method of dissolving the indicated proportions of the components in water. We prefer, however, to blend aqueous solutions of the individual components HF and NH4F, respectively. We find that the standard HF solution containing 49% hydrogen fluoride by weight is well adapted for this purpose. Using this 49% HF solution, it is necessary to employ an ammonium fluoride solution of concentration between about 15% and about 40% NH4F by weight, by blending, solutions containing the desired relative proportions of the two components. Blends of 1 part by weight of a 49% by weight aqueous hydrogen fluoride solution and between 4 and 100 parts by volume of 15% to 48% by weight aqueous ammonium fluoride can be used. Such blends produce mixtures containing from about 1% to about 11% HF and from about 13.5% to 40.5% NH4F by weight, the remainder water. To this is added a low metal ion version of the dissolved preferred fluoroalkylsulfonate and the solution filtered through an 0.2 micron filter.

The determined effective concentration range is 25 to 20,000 ppm added as active surfactant. It may be added as a solid or as a solution in an aqueous polar solvent mixture. The desired concentration range is from 200 to 5000 ppm active surfactant.

In some applications, a suitable diluent to lower, i.e., depress, the corrosive effect may be added. Suitable diluents include, for example, acetic, ethylene glycol, and lower alkyl alcohols, e.g., of 1 to 3 carbon atoms.

The following specific examples further illustrate the invention. It will be understood, however, that although these examples may describe in detail certain preferred operating conditions of the invention, they are given primarily for purposes of illustration and the invention in its broader aspects is not limited thereto.

EXAMPLES 1-7

To a solution of between 6:1 and 7:1 parts by volume ammonium fluoride (40% by weight) to parts by volume hydrofluoric acid (49% by weight) respectively, the surfactant was added at a level of 250 ppm. Surface tensions were measured using a Du Nouy Ring tensiometer at 25° C. The solutions (as identified in Table 1) were filtered through 0.2 μm Teflon filter and solutions were remeasured for surface tension using the same method. Table 1 summarizes the results.

TABLE 1

| Examples | | Surface Tension Before Filtration Dynes/cm | Surface Tension After Filtration Dynes/cm |
|---|---|---|---|
| (1) | LI No. 2[a] | 24.2 | 26.0 |
| (2) | LI No. 1[b] | 33.8 | 53.5 |
| (3) | $C_3H_7SO_3H$[c] | 67.2 | 67.7 |
| (4) | None* | 89 | 89 |
| (5) | $C_8F_{17}SO_3K$* | 21.6 | 72.7 |
| (6) | Zonyl FSH[d]* | 25.2 | 76.7 |

TABLE 1-continued

| Examples | | Surface Tension Before Filtration Dynes/cm | Surface Tension After Filtration Dynes/cm |
|---|---|---|---|
| (7) | Triton X-100[e]* | 39.3 | 70.8 |

*(comparative)
[a]perfluoroalkyl sulfonate with alkyl groups of 4-7 carbon atoms.
[b]fluorinated amphoteric surfactant (linear perfluoro alkyl sulfonate of 3-6 carbon atoms).
[c]solubility of $C_3H_7SO_3H$ was high but activity was low and substantial reduction of surface tension occurred even at 3% by weight addition. Higher alkyl sulfonates up to C-10 may also be employed.
[d]$R_fCH_2CH_2O(CH_2CH_2O)_xA$ where $R_f$ is $F(CF_2CF_2)$3-9 and x is 6-20
[e]$C_8H_{17}$—$C_6H_4$—$(OCH_2CH_2)_{6-12}OH$
[f]ammonium perfluoro alkyl sulfonate of 8-10 carbon atoms.

Test for uniformity of etch after etchant filtration at 0.2 μm.

Three inch silicon wafers were oxidized thermally at 1100° C. in $O_2$ to about 7000 A, coated with positive photoresist to a thickness of about 2 μm and patterned using test mask having varying geometries of about 1.5 to 20 μm in size. After hardening the resist for about 20 minutes at 130° C., the patterned wafers were dipped into the 0.2 μm filters which contain 6 parts of volume ammonium fluoride (40% by weight) and 1 part by volume composition hydrofluoric acid (49% by weight) containing its desired surfactant at 25° C. until the 100% etch time had been obtained. The etched pattern was then rinsed in water. This etch procedure was repeated for the 110% etch time for each composition. The wafers were inspected with a light microscope with magnifications from 200 to 400 times for clearing of geometries. Table 2 shows the results.

TABLE 2

| Examples | % Etch time | Percent of Completely Etched Geometries | | | | | |
|---|---|---|---|---|---|---|---|
| | | 20 μm | 10 micron | 15 μm | 4 μm | 3 μm | 2 μm |
| LI No. 2 | 105 | 100 | 100 | 100 | 100 | 100 | 100 |
| none* | 105 | 100 | 5 | 50 | 60 | 70 | 63 |
| FC-93* | 105 | 100 | 96 | 56 | 60 | 31 | 96 |

*(Comparative)

It will be understood that various modifications may be made in the compositions described without departing from the scope of the invention and the several details disclosed as illustrative are not to be construed as placing limitations on the invention except as may be recited in the appended claims.

What is claimed is:

1. An etching solution containing a surfactant which is stable against precipitation of the surfactant comprising an aqueous mixture of ammonium fluoride and surfactant that contains between 13.5 and 45 weight percent ammonium fluoride (NH4F) and between 25 and 20,000 ppm of a fluoroalkylsulfonate surfactant of the formula

$XF_2C(CFY)_nSO_3A$ wherein n has a value of up to 12, the carbon chain may be linear or branched, X may be F, OH, or $SO_3A$, Y may be F, H, OH or be omitted and A may be $H^+$, $NH_4^+$, $Na^+$, $K^+$, $Li^+$, $R^+$ or $NR_4^+$ wherein R is a 1 to 4 carbon atom alkyl group and mixtures thereof and the remainder being water.

2. An etching solution according to claim 1 containing up to 11 weight percent hydrogen fluoride.

3. The etching solution of claim 1 wherein the value of n in the fluoroalkylsulfonate surfactant is 3 to 6.

4. The etching solution of claim 1 wherein the fluorinated alkylsulfonate is the ammonium salt and is low in metal ion content.

5. The etching solution of claim 1 wherein the fluorinated alkyl sulfonate is fluorinated alkyl sulfonic acid.

6. An etching solution of claim 1 wherein the fluoroalkylsulfonate surfactant is present in amounts of 200 to 5000 ppm and is added to the etchant solution as a dry solid of as a solution in an aqueous polar solvent mixture.

7. An etchant solution according to claim 1 containing up to 11 weight percent hydrogen fluoride, between 200 and 500 ppm fluoroalkylsulfonate surfactant diluent to lessen corrosion.

8. The etching solution of claim 2 containing up to 50 weight percent as a corrosion depressing diluent selected from the group consisting of acetic acid, ethylene glycol, and a 1 to 3 carbon atom alcohol.

9. The process for producing the etching solution which comprises blending 49% by weight aqueous hydrogen fluoride and a 15% to 40% by weight aqueous solution of ammonium fluoride, with 200 to 5000 ppm active fluoroalkylsulfonate surfactant.

10. The process according to claim 9 wherein the aqueous ammonium fluoride contains about 30% $NH_4F$ by weight.

* * * * *